US006590515B1

(12) United States Patent
Dacy et al.

(10) Patent No.: US 6,590,515 B1
(45) Date of Patent: Jul. 8, 2003

(54) MIXING DIGITAL TO ANALOG CONVERTER

(75) Inventors: Susan Mary Dacy, Cambridge, MA (US); Richard Eugene Schreier, North Andover, MA (US)

(73) Assignees: Analog Devices, Inc., Norwood, MA (US); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/116,233

(22) Filed: Apr. 4, 2002

(51) Int. Cl.[7] .................................................. H03M 1/66

(52) U.S. Cl. ........................................ 341/144; 341/120

(58) Field of Search ............................... 341/144, 119, 341/118, 120

(56) References Cited

U.S. PATENT DOCUMENTS 5,790,060 A * 8/1998 Tesch .......................... 341/119

\* cited by examiner

Primary Examiner—Peguy JeanPierre
Assistant Examiner—Joseph Lauture
(74) Attorney, Agent, or Firm—Iandiorio & Teska

(57) ABSTRACT

A mixing DAC includes an analog output network; a current source; a current switching circuit connected between the current source and the analog output network; a switch driver circuit responsive to a digital input at a first rate and a clock signal having a predetermined period for driving the current switching circuit to selectively interconnect the current source and the analog output network; and a waveform generator for driving the current source to produce an output current including a plurality of peaks at a second rate during each clock period to up-convert the response energy of the DAC analog output to approximately the second rate.

8 Claims, 3 Drawing Sheets

US 6,590,515 B1

MIXING DIGITAL TO ANALOG CONVERTER

FIELD OF THE INVENTION

This invention relates to a mixing digital to analog converter (DAC) and more particularly to such a mixing DAC which operates internally, without the need for an extra mixer circuit.

BACKGROUND OF THE INVENTION

Conventional digital to analog converters (DAC's) receive a digital input at a predetermined rate and provide an analog output at the same rate. In RF applications the output of the DAC is then up-converted through a separate mixer circuit. Additionally, high frequency DACs suffer from clock jitter which causes errors in the analog output signal. Jitter is caused by dynamic errors at the switching instant. One approach to the jitter problem, the return to zero approach, reduces the jitter by reducing the current to zero at the instant of switching.

BRIEF SUMMARY OF THE INVENTION

This invention provides a mixing DAC for up-converting the analog output from the digital input without additional mixer circuits.

It is a further object of this invention to provide such a mixing DAC which preserves the return to zero solution to the jitter problem.

The invention results from the realization that a mixing DAC which automatically, internally, up-converts the analog output from the digital input can be achieved by varying the current output from each current source and each DAC. The current output has a plurality of peaks occurring at a predetermined rate, each clock period resulting in an analog output from the DAC which is up-converted to a rate commensurate to the predetermined input rate.

This invention features a mixing DAC including an analog output network, a current source, and a current switching circuit connected between the current source and the analog output network. A switch driver circuit responsive to a digital input at a first rate and a clock signal having a predetermined period, drives the current switching circuit to selectively interconnect the current source and the analog output network. A waveform generator drives the current source to produce an output current including a plurality of peaks at a second rate during each clock period to up-convert the response energy of the DAC analog output to approximately the second rate.

In a preferred embodiment, the current source, the current switching circuit, and the switch driver circuit may constitute a cell and there may be a plurality of such cells in the DAC. One waveform generator may drive all of the cells or there may be a waveform generator included in each cell. The current source in each cell may produce the output current at the same second rate. At least some of the current sources may produce the output current at other than the second rate. A current generator output current may be substantially sinusoidal. There may be valleys between the peaks of the current source output current and the valleys may be at substantially zero current.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
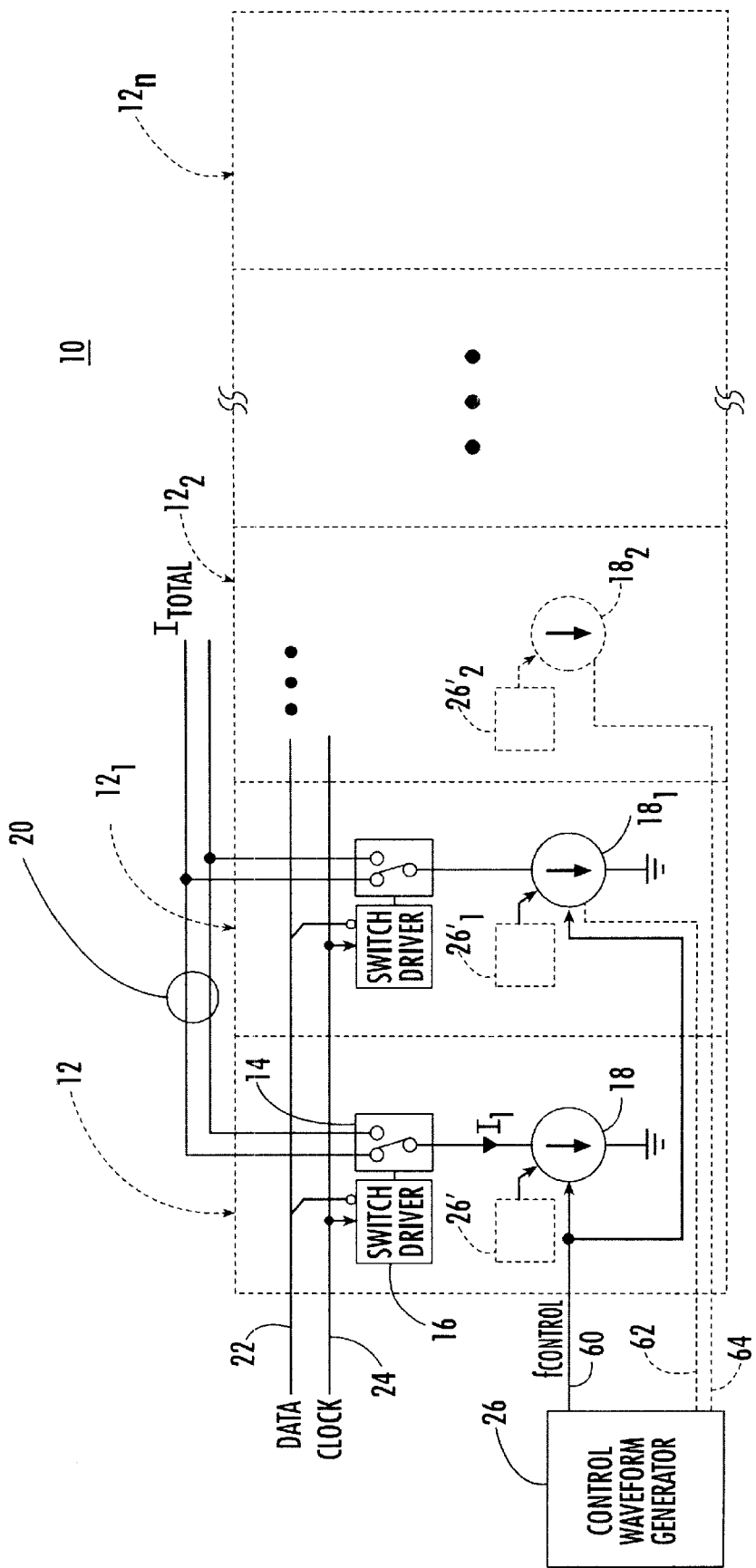
FIG. 1 is a simplified schematic block diagram of a mixing digital to analog converter according to this invention.

There is shown in FIG. 1 a mixing digital to analog converter 10 according to this invention including one or more cells 12, $12_1$, $12_2$, $12_n$ each of which as illustrated by cell 12 includes a current switching circuit 14, a switch driver 16 which drives current switch 14. Current switch 14 connects current source 18 to analog output network 20. Switch driver 16 responds to the data input on line 22 and the clock input on line 24 to apply the clocked data to current switch 14 and selectively apply the current source to analog output network 20.

Figure 2:
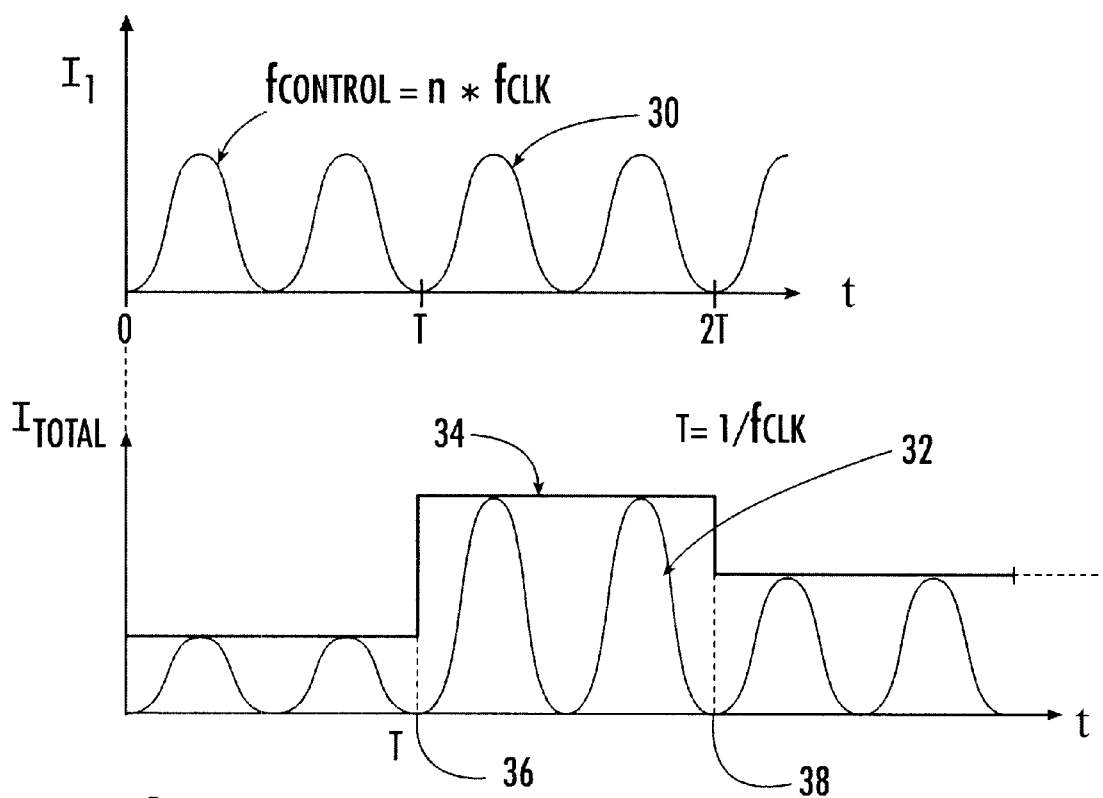
FIG. 2 illustrates the current in each element and total output current occurring in the DAC of FIG. 1.

In accordance with this invention, control waveform generator 26 drives current source 18 so that instead of a constant current it provides a varying current 30, FIG. 2, having a plurality of peaks, that is at least two peaks for each clock cycle. The clock cycle, in FIG. 2, is defined as T. The current $I_1$ is provided by source 18 in FIG. 1. The frequency of the output current, then, of current source 18 as controlled by waveform generator 26, has a frequency equal to n times the clock frequency. As a result, the output current $I_{total}$ appearing on analog output network 20 appears as at 32, FIG. 2, where the switching envelope 34 follows the clocked data, but the underlying output signal 32 has approximately the frequency of the current source fluctuation as controlled by waveform generator 26. Thus, the frequency response energy of the DAC analog output has been up-converted to the vicinity of the frequency of the control signal from waveform generator 26 and appears on the analog output network 20. By making the frequency $f_{control}$ of the waveform generator output to current source 18 equal to n times the clock signal, the valleys or zero points 36 and 38, FIG. 2, are made to align with the transitions so that the clock jitter benefits of a typical return to zero circuit can be maintained. In one embodiment these are zeroed, but this is not a necessary limitation of the invention. In addition, although the waveforms are shown as sinusoids in FIG. 2, this is not a necessary limitation of the invention. Any periodic peak configuration will work.

Figure 3:
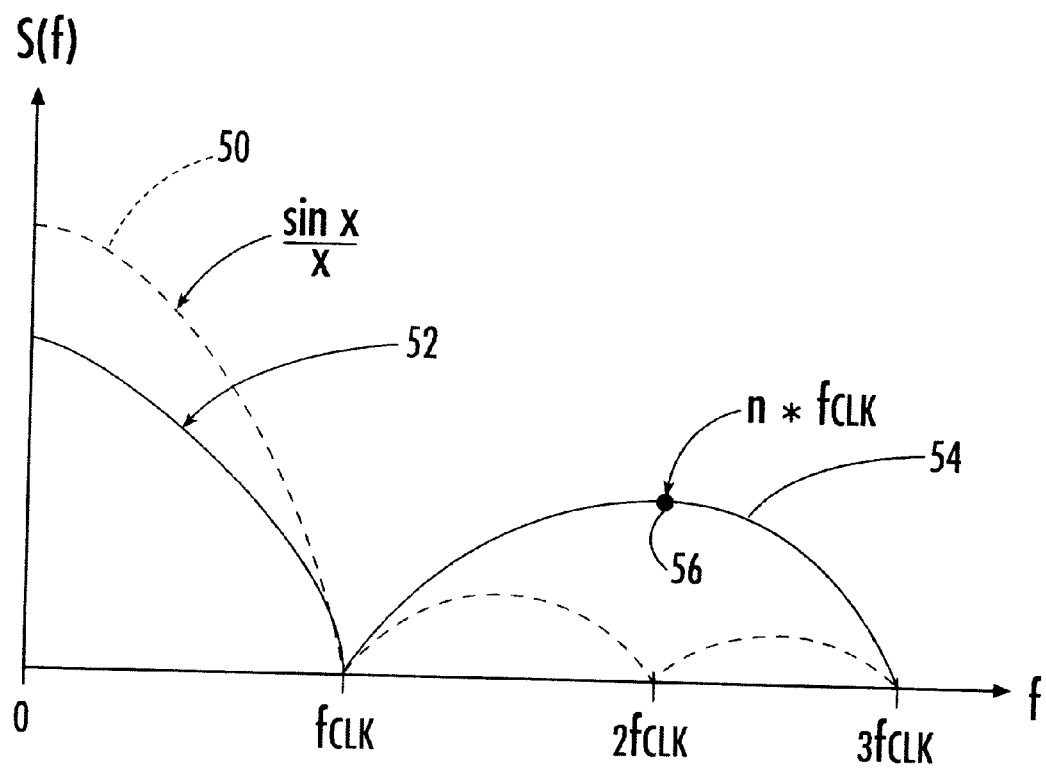
FIG. 3 is a power spectrum of the DAC response plotted against frequency for prior art DAC's and the mixing DAC according to this invention.

The effectiveness of the invention is illustrated in FIG. 3 where a conventional DAC power spectrum 50, FIG. 3, which is a function of sine x/x have nulls at $f_{clock}$, $2f_{clock}$, $3f_{clock}$ and so on. Thus, using a high frequency image at the output is contraindicated because of the low energy nulls at each of the clock multiples. In accordance with this invention as shown by characteristic 52, the power curve can be controlled so that instead of a null at, for example $2f_{clock}$, there can be a peak and thus the DAC up conversion can be effected efficiently by simply changing the value of n. The lobe 54 of characteristic 52 can be reshaped so that the peak point 56 now over $2f_{clock}$ can be positioned over $3f_{clock}$, $4f_{clock}$ and so on. Although in FIG. 1 control waveform generator 26 is shown as supplying the same control 60 to each current source 18, $18_1$, etc. this is not a necessary limitation of the invention. For example, waveform generator 26 could provide a different control signal to each of current sources 18, $18_1$, etc. one over line 60 to current source 18, another over line 62 to current source $18_1$, another over line 64 to current source 18$_2$, and so on. Alternatively, instead of a universal waveform generator 26, there can be a separate waveform generator 26', 26'$_1$, 26'$_2$ associated with each current source which may provide the same or differing control to its respective current source.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

1. A mixing DAC comprising: an analog output network; a current source; a current switching circuit connected between said current source and said analog output network; a switch driver circuit responsive to a digital input at a first rate and a clock signal having a predetermined period for driving said current switching circuit to selectively interconnect said current source and said analog output network; and a waveform generator for driving said current source to produce an output current including a plurality of peaks at a second rate during each said clock period to up-convert the response energy of the DAC analog output to approximately said second rate.

2. The mixing DAC of claim 1 in which said current source, said current switching circuit and said switch driver circuit constitute a cell and there are a plurality of such cells in the DAC.

3. The mixing DAC of claim 2 in which said waveform generator drives all of said cells.

4. The mixing DAC of claim 2 in which said waveform generator is included in each said cell.

5. The mixing DAC of claim 2 in which each said current source in each said cell produces said output current at the same said second rate.

6. The mixing DAC of claim 2 in which at least some of said current sources produce said output current at other than said second rate.

7. The mixing DAC of claim 1 in which said current source output current is substantially sinusoidal.

8. The mixing DAC of claim 1 in which there are valleys between said peaks of said current source output current and said valleys are at substantially zero current.

* * * * *